(12) United States Patent
Kobayashi et al.

(10) Patent No.: US 12,090,570 B2
(45) Date of Patent: Sep. 17, 2024

(54) LASER PROCESSING APPARATUS, LASER PROCESSING METHOD, AND METHOD FOR MANUFACTURING SEMICONDUCTOR APPARATUS

(71) Applicant: JSW AKTINA SYSTEM CO., LTD, Yokohama (JP)

(72) Inventors: Naoyuki Kobayashi, Yokohama (JP); Masashi Machida, Yokohama (JP); Hiroaki Imamura, Yokohama (JP)

(73) Assignee: JSW AKTINA SYSTEM CO., LTD, Yokohama (JP)

( * ) Notice: Subject to any disclaimer, the term of this patent is extended or adjusted under 35 U.S.C. 154(b) by 0 days.

(21) Appl. No.: 18/373,617

(22) Filed: Sep. 27, 2023

(65) Prior Publication Data

US 2024/0024980 A1 Jan. 25, 2024

Related U.S. Application Data

(62) Division of application No. 16/772,072, filed as application No. PCT/JP2018/003564 on Feb. 2, 2018, now Pat. No. 11,813,694.

(51) Int. Cl.
*B23K 26/035* (2014.01)
*B23K 26/384* (2014.01)
*B23K 101/40* (2006.01)

(52) U.S. Cl.
CPC .......... *B23K 26/035* (2015.10); *B23K 26/384* (2015.10); *B23K 2101/40* (2018.08)

(58) Field of Classification Search
CPC .............. B23K 26/067; B23K 26/0673; B23K 26/0613; B23K 26/064; B23K 26/0604;
(Continued)

(56) References Cited

U.S. PATENT DOCUMENTS 9,245,757 B2  1/2016  Shida et al.
2002/0132402 A1* 9/2002 Tanaka .............. H01L 29/78621
                                                257/E27.111
(Continued)

FOREIGN PATENT DOCUMENTS

JP    H5-031354 A    2/1993
JP   2001-338893 A  12/2001
(Continued)

OTHER PUBLICATIONS

International Search Report from International Patent Application No. PCT/JP2018/003564, Mar. 6, 2018.

*Primary Examiner* — Vy T Nguyen
(74) *Attorney, Agent, or Firm* — Potomac Law Group, PLLC

(57) ABSTRACT

A laser processing apparatus and a laser processing method that can effectively prevent a processing time for one semiconductor film from increasing are provided. A laser processing apparatus (1) according to an embodiment includes a laser light source (2) configured to irradiate a semiconductor film (M1) with a laser beam, a film state measuring instrument (5) configured to measure a state of the semiconductor film after the semiconductor film (M1) is irradiated with the laser beam, and a laser light adjusting mechanism configured to adjust a timing at which the semiconductor film (M1) is irradiated with a next laser beam and intensity of the laser beam according to the state of the semiconductor film (M1) measured by the film state measuring instrument (5).

7 Claims, 13 Drawing Sheets

(58) Field of Classification Search
CPC .......... B23K 26/0648; B23K 2101/40; B23K 26/00; B23K 26/032; B23K 26/0676; B23K 26/073; B23K 26/035; B23K 26/0643; B23K 26/38; B23K 2103/50; B23K 2103/56; B23K 26/02; B23K 26/06; B23K 26/0617; B23K 26/0626; B23K 26/066; B23K 26/0665; B23K 26/0732; B23K 26/0736; B23K 26/082; B23K 26/0876; B23K 26/40; B23K 26/53; B23K 15/0013; B23K 2101/36; B23K 2103/42; B23K 2103/52; B23K 26/0006; B23K 26/03; B23K 26/04; B23K 26/042; B23K 26/043; B23K 26/0608; B23K 26/0622; B23K 26/0624; B23K 26/0652; B23K 26/0738; B23K 26/0869; B23K 26/0884; B23K 26/0892; B23K 26/10; B23K 26/14; B23K 26/206; B23K 26/21; B23K 26/26; B23K 26/28; B23K 26/354; B23K 26/382; B23K 26/702; B23K 26/705; B23K 26/707; B23K 31/125; G02B 6/4296; G02B 6/4214; G02B 26/0816; G02B 6/2848; G02B 6/3512; G02B 6/3514; G02B 6/4206; G02B 6/425; G02B 26/08; G02B 27/106; G02B 27/141; G02B 27/144; G02B 27/145; G02B 6/2817; G02B 6/32; G02B 6/352; G02B 6/355; G02B 6/3598; G02B 19/0014; G02B 19/0047; G02B 26/023; G02B 26/04; G02B 27/0977; G02B 27/102; G02B 27/14; G02B 27/147; G02B 27/30; G02B 6/262; G02B 6/3528; G02B 6/354; G02B 6/3548; G02B 6/3558; G02B 6/356; G02B 6/3564; G02B 6/3604; G02B 6/4292; H01S 3/0071; H01S 3/005; H01S 3/025; H01S 3/10; H01S 3/2383; H01S 3/00; H01S 3/0057; H01S 3/067; H01S 3/06704; H01S 3/10069; H01S 3/13; H01S 3/1305; H01S 3/1312; H01S 5/0021; H01S 5/005; H01S 5/02251; H01S 5/06825; H01S 5/0683; H01S 5/4012; H01S 5/4087; H01L 21/02675; H01L 21/02691; H01L 21/02532; H01L 21/02678; H01L 21/02686; H01L 21/268; H01L 21/32136; H01L 21/324; H01L 27/12; H01L 27/1285; H01L 29/66757; H01L 29/78621; H01L 29/78675; H01L 2924/00; H01L 2924/0002; H01L 21/0242; H01L 21/02422; H01L 21/02488; H01L 21/02683; H01L 21/20; H01L 21/67115; H01L 23/5258; G02F 1/133351; G01J 1/0414; G01J 1/0422; G01J 1/0425; G01J 1/4228; G01J 1/4257
USPC .......... 219/121.77, 121.6, 121.61, 121.74, 219/121.76, 121.62, 121.65, 121.68, 219/121.7, 121.73, 121.79, 121.82; 359/629, 226.1, 636; 438/795, 16, 308, 438/487, 5; 257/21.311 E, 21.413 E, 257/23.15 E, 27.111 E, 29.278 E, 29.293; 356/237.2

See application file for complete search history.

(56) References Cited

U.S. PATENT DOCUMENTS

| | | |
|---|---|---|
| 2003/0116545 A1 | 6/2003 | Kaji |
| 2004/0253838 A1 | 12/2004 | Yamazaki et al. |
| 2013/0330844 A1* | 12/2013 | Hawryluk .......... H01L 21/268 438/795 |
| 2014/0256161 A1 | 9/2014 | Li et al. |

FOREIGN PATENT DOCUMENTS

| | | |
|---|---|---|
| JP | 2002-270510 A | 9/2002 |
| JP | 2004-006876 A | 1/2004 |
| JP | 2006-135192 A | 5/2006 |
| JP | 3794482 B2 | 7/2006 |
| JP | 2007-258234 A | 10/2007 |
| JP | 2009-158822 A | 7/2009 |
| JP | 2012-002905 A | 1/2012 |
| JP | 2014-029965 A | 2/2014 |

* cited by examiner

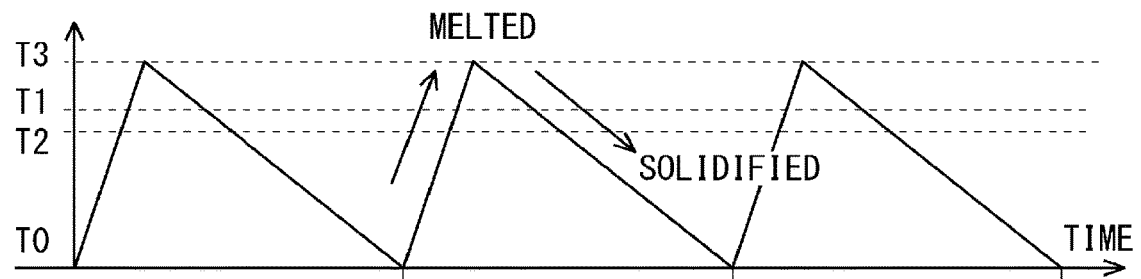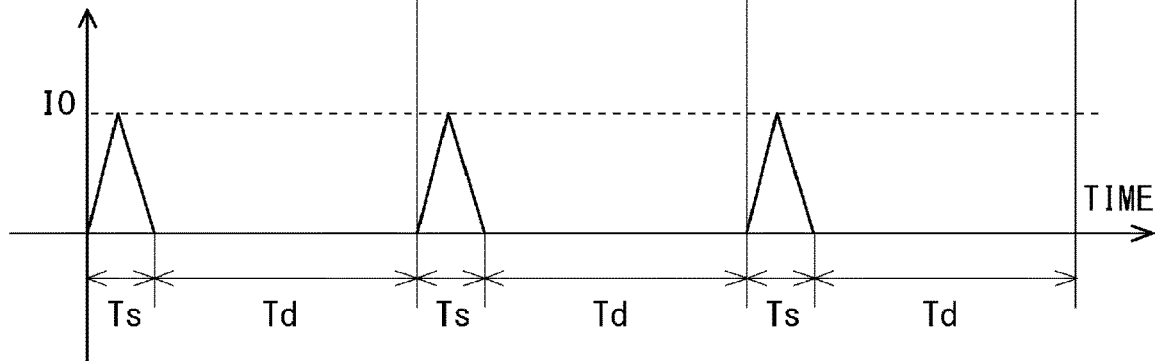
Fig. 3

LASER PROCESSING APPARATUS, LASER PROCESSING METHOD, AND METHOD FOR MANUFACTURING SEMICONDUCTOR APPARATUS

TECHNICAL FIELD

The present disclosure relates to a laser processing apparatus, a laser processing method, and a method for manufacturing a semiconductor apparatus.

BACKGROUND ART

A laser processing apparatus that irradiates a semiconductor film such as an amorphous silicon film formed over a substrate with a laser beam to crystallize or modify the semiconductor film is known. Patent Literature 1 discloses a technique for measuring a film surface shape by a laser processing apparatus.

CITATION LIST

Patent Literature

Patent Literature 1: Japanese Patent No. 3794482

SUMMARY OF INVENTION

Technical Problem

Incidentally, with a laser processing apparatus according to a comparative example developed by the present inventors, the number of times of laser beam irradiation per one location over a semiconductor film is set to 10 to 20 times. In each time of the laser beam irradiation, the temperature of the part of the semiconductor film where it is irradiated with the laser beam is raised from a normal temperature to near the melting temperature (melting point). The crystals of the semiconductor film grow gradually by repeating melting and solidification. In other words, regarding the crystal growth in the semiconductor film, it is considered that the crystal grains generated in the first irradiation are connected to each other and become larger through the second and subsequent irradiations. However, with the laser processing apparatus according to the above comparative example, the temperature of the semiconductor film which has been raised by one irradiation of the laser beam needs to fall to the normal temperature before next irradiation of a laser beam. Thus, the processing time for one semiconductor film becomes longer, and the throughput becomes longer.

Other problems and novel features will be apparent from the description of the present specification and the accompanying drawings.

Solution to Problem

An example aspect is a laser processing apparatus includes: a laser light source configured to irradiate a semiconductor film with a laser beam; a film state measuring instrument configured to measure a state of the semiconductor film after the semiconductor film is irradiated with the laser beam; and a laser light adjusting mechanism configured to adjust a timing at which the semiconductor film is irradiated with a next laser beam and intensity of the laser beam according to the state of the semiconductor film measured by the film state measuring instrument.

Another example aspect is a laser processing method including the steps of: measuring a state of a semiconductor film irradiated with a laser beam by a laser light source; and adjusting a timing at which the laser light source irradiates a semiconductor film with a next laser beam and intensity of the laser beam according to the state of the semiconductor film.

Advantageous Effects of Invention

According to the above example aspects, it is possible to provide a laser processing apparatus and a laser processing method that can effectively prevent a processing time for one semiconductor film from increasing.

BRIEF DESCRIPTION OF DRAWINGS

FIG. 3 is a schematic diagram for explaining a laser processing method according to Comparative Example 1.

DESCRIPTION OF EMBODIMENTS

Hereinafter, specific embodiments will be described in detail with reference to the drawings. However, the present disclosure is not limited to the following embodiments. In addition, the following description and drawings are simplified as appropriate for clarity of descriptions. The same elements are denoted by the same reference signs throughout the drawings, and repeated description is omitted as necessary.

First Embodiment

Configuration of Laser Processing Apparatus According to First Embodiment

First, a configuration of a laser processing apparatus according to a first embodiment will be described with reference to FIG. 1.

Figure 1:
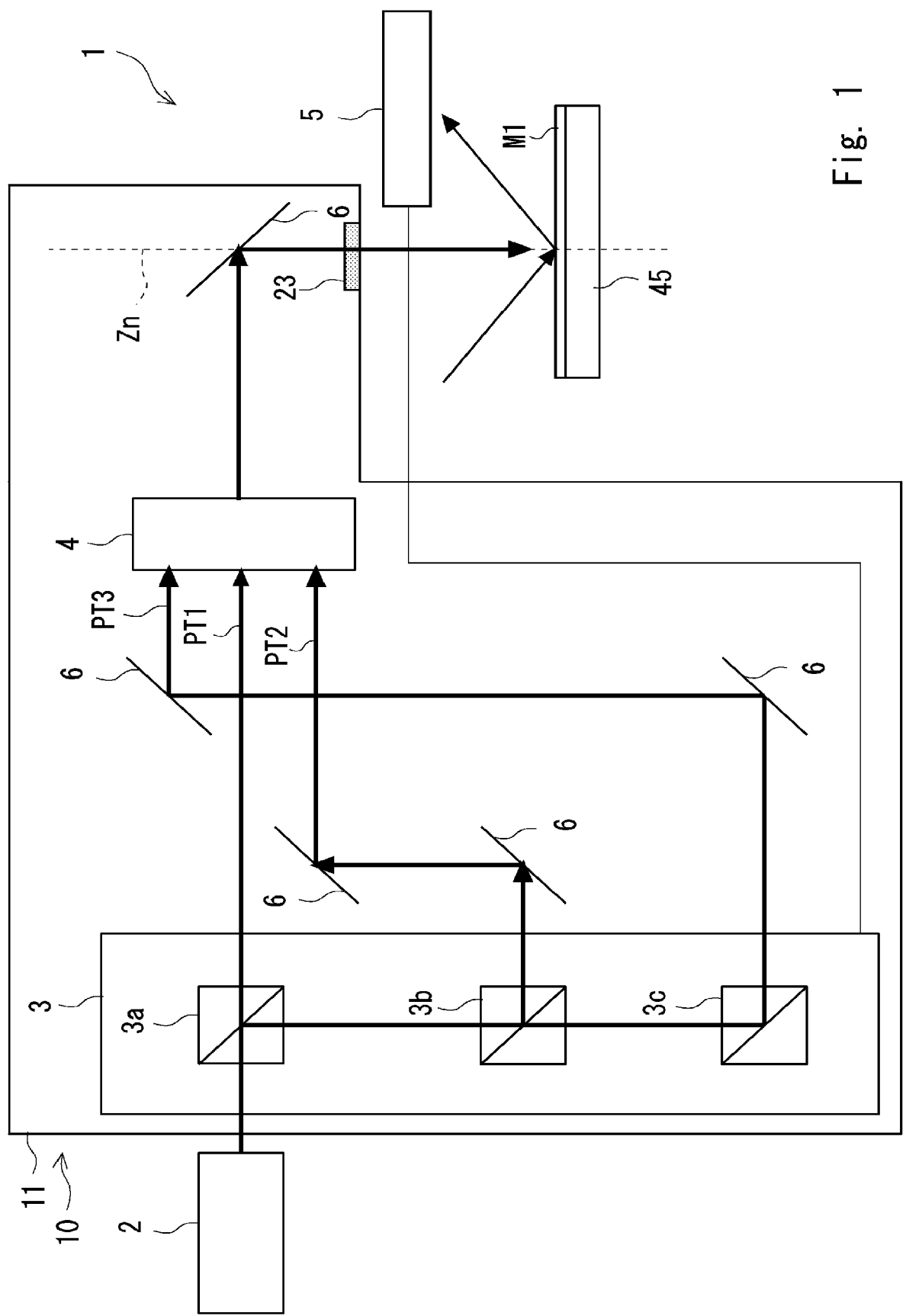
FIG. 1 is a diagram for explaining a configuration of a laser processing apparatus according to a first embodiment.

FIG. 1 is a diagram for explaining a configuration of a laser processing apparatus 1 according to this embodiment. The laser processing apparatus 1 is an apparatus for irradiating the semiconductor film M1 formed over a substrate with laser beams to crystallize the semiconductor film M1. Here, the semiconductor film M1 is, for example, a crystallized Si film of a thin film transistor (TFT) used for a screen of a liquid crystal display device. In forming the semiconductor film M1, the semiconductor film M1 is irradiated with a laser beam composed of a line beam, and an amorphous silicon film (a-Si film) is crystallized to form a polysilicon film (p-Si film). As shown in FIG. 1, the laser processing apparatus 1 includes a laser light source (laser oscillator) 2, an optical system module 10, and a film state measuring instrument 5.

The laser light source 2 is a laser light source that generates pulsed laser beams by a pulse oscillation operation. The optical system module 10 includes an optical system casing 11 that constitutes an outer shape, optical elements such as a partial reflection mirror 3, reflection mirrors 6, and a homogenizer 4, and a sealing window 23. Laser beams generated by the laser light source 2 are guided to the partial reflection mirror 3 of the optical system module 10. The partial reflection mirror 3 is composed of a first partial reflection mirror 3a, a second partial reflection mirror 3b, and a third partial reflection mirror 3c. The first partial reflection mirror 3a, the second partial reflection mirror 3b, and the third partial reflection mirror 3c are optical apparatuses configured to be able to change the transmittance, i.e., to be able to transmit some of the incident laser beams and reflect the rest. The partial reflection mirror 3 has a role as a laser beam adjusting mechanism for adjusting the timing at which the semiconductor film M1 is irradiated with a next laser beam and adjusting the intensity of the laser beam according to the state of the semiconductor film M1 measured by the film state measuring instrument 5.

A laser beam emitted from the laser light source 2 is first guided to the first partial reflection mirror 3a. The laser beam transmitted through the first partial reflection mirror 3a is guided to the homogenizer 4. The homogenizer 4 is composed of a plurality of cylindrical lenses and makes the intensity distribution uniform in a rectangular shape. On the other hand, the laser beam reflected by the first partial reflection mirror 3a is guided to the second partial reflection mirror 3b. A direction of the laser beam reflected by the second partial reflection mirror 3b is changed by the plurality of reflection mirrors 6, and the laser beam is guided to the homogenizer 4. On the other hand, the laser beam transmitted through the second partial reflection mirror 3b is guided to the third partial reflection mirror 3c. A direction of the laser beam incident on the third partial reflection mirror 3c is reflected by the third partial reflection mirror 3c, a direction of the laser beam is changed by the plurality of reflection mirrors 6, and the laser beam is guided to the homogenizer 4.

There is a difference between a length of a first optical path PT1, a length of a second optical path PT2, and a length of a third optical path PT3. The first optical path PT1 is an optical path that guides a light beam reflected by the first partial reflection mirror 3a to the homogenizer 4, the second optical path PT2 is an optical path that guides a light beam reflected by the second partial reflection mirror 3b to the homogenizer 4, and the third optical path PT3 is an optical path that guides a light beam reflected by the third partial reflection mirror 3c to the homogenizer 4. The third optical path PT3 is the longest, and the first optical path PT1 is the shortest (third optical path PT3>second optical path PT2>first optical path PT1). Thus, when a laser beam is emitted once from the laser light source 2, the laser beam first reaches the semiconductor film M1 through the first optical path PT1. Next, the laser beam reaches the semiconductor film M1 through the second optical path PT2. Lastly, the laser beam reaches the semiconductor film M1 through the third optical path PT3. In this manner, the time interval (irradiation interval) at which the semiconductor film M1 is irradiated with the laser beams can be changed by making the length of the optical path variable.

Further, the intensity of the laser beam can be changed by changing the transmittance of the partial reflection mirror 3. That is, by changing the transmittances of the first partial reflection mirror 3a and the second partial reflection mirror 3b, the intensity of the laser beams through the first optical path PT1, the second optical path PT2, and the third optical path PT3 can be changed, respectively.

The semiconductor film M1 is disposed over a substrate stage 45. The film state measuring instrument 5 is for measuring a state of the semiconductor film M1 after the laser beam irradiation. The film state measuring instrument 5 detects the state of the semiconductor film M1 by measuring at least one of a reflectance, a transmittance, an emissivity, and a resistance value of the semiconductor film M1. FIG. 1 shows an example in which the film state measuring instrument 5 measures the reflectance of the semiconductor film M1.

Figure 2:
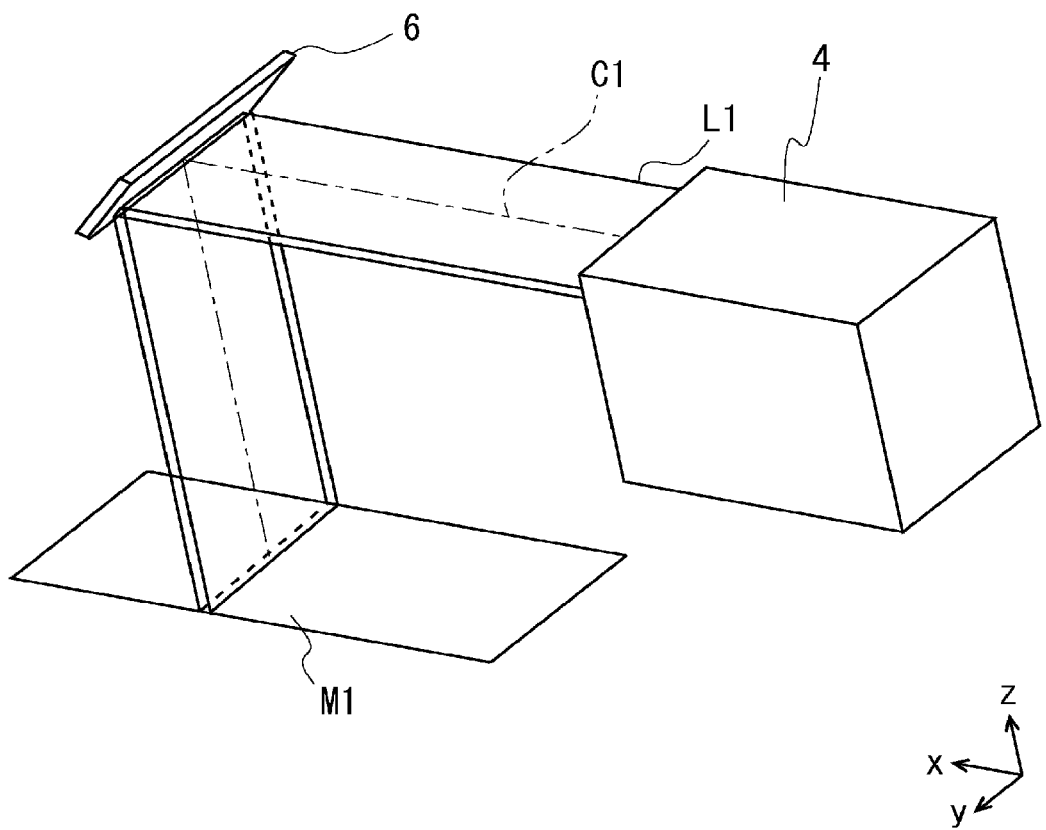
FIG. 2 is a schematic diagram showing a laser beam generated by a laser beam source of the laser processing apparatus according to the first embodiment.

FIG. 2 is a schematic diagram showing a laser beam applied to the semiconductor film M1. As shown in FIG. 2, a laser beam L1 becomes a line beam after passing through the homogenizer 4. That is, a cross section of the laser beam L1 orthogonal to an optical axis Cl is an elongated linear shape extending in one direction. For example, a cross section of the laser beam L1 orthogonal to the optical axis reflected by the reflection mirror 6 is a linear shape extending in the Y-axis direction. In order to crystallize the entire surface of the a-Si film over the semiconductor film M1, the semiconductor film M1 is moved along the short axis direction (X-axis direction) of the line beam intermittently at a feed pitch of 5 to 10% of the short axis width of the line beam in one shot of the line beam. For example, when the short axis width is 0.4 mm, the feed pitch is 20 to 40 μm, and the number of times of the a-Si film 5a is irradiated with laser beams per location is 10 to 20 times.

When the laser light source 2 emits a laser beam once, the semiconductor film M1 is irradiated with a laser beam three times at different timings. For example, when the laser light source 2 emits a laser beam seven times, the semiconductor film M1 is irradiated with the laser beams 21 times at different timings. The semiconductor film M1 is irradiated with the laser beams that have passed through the optical paths having different lengths, in accordance with the order of the respective lengths of the optical paths. That is, the semiconductor film M1 is irradiated firstly with the laser beam through the first optical path PT1 having the shortest optical path length. Then, the semiconductor film M1 is secondly irradiated with the laser beam through the second optical path PT2. After that, the semiconductor film M1 is thirdly irradiated with the laser beam through the third optical path PT3.

When a laser beam having energy density E0 is emitted from the laser light source 2 once, the energy density of the laser beam reaching the semiconductor film M1 first is defined as E1, the energy density of the laser beam reaching the semiconductor film M1 second is defined as E2, and the energy density of the laser beam reaching the semiconductor film M1 third is defined as E3. The reflectance of the first partial reflection mirror 3a is defined as R1, the transmittance thereof is defined as T1, the reflectance of the second partial reflection mirror 3b is defined as R2, the transmittance thereof defined as T2, and the reflectance of the third partial reflection mirror 3c is defined as R3. Then, E1, E2, and E3 are respectively expressed by the following formulas.

$$E1 = T1 \cdot E0$$

$$E2 = (R1 \cdot R2) \cdot (E0)$$

$$E3 = (R1 \cdot T2 \cdot R3) \cdot (E0)$$

From the above formulas, a ratio r2 of the energy density E1 of the laser beam that reaches the semiconductor film M1 first to the energy density E2 of the laser beam that reaches the semiconductor film M1 second is r2=E2/E1=R1·R2/T1. Further, a ratio r3 of the energy density E1 of the laser beam that reaches the semiconductor film M1 first to the energy density E3 of the laser beam that reaches the semiconductor film M1 third is r3=E3/E1=r3=(T2·R1·R3)/T1. In this way, the ratios r1 and r2 can be changed by appropriately changing R1 to R3 and T1 to T3.

Laser Processing Method According to Comparative Example 1

Next, a laser processing method according to Comparative Example 1, which has been studied by the present inventor in advance, will be described.

FIG. 3 is a schematic diagram for explaining a laser processing method according to Comparative Example 1. In FIG. 3, the relationship between the temperature of the semiconductor film M1 and time is shown in the upper part, and the relationship between the laser beam intensity and time is shown in the lower part. As shown in FIG. 3, the laser processing method according to Comparative Example 1 includes the following steps.

(a) The semiconductor film M1 is irradiated with a first laser beam having energy density I0 (peak value) from the laser light source 2, and the temperature of the semiconductor film M1 (temperature of the semiconductor film M1 at the laser beam irradiation position) is raised to a temperature T3 higher than or equal to a melting point T1.

(b) The semiconductor film M1 is irradiated with a second laser beam having energy density I0 after the temperature of the semiconductor film M1 is lowered to near a normal temperature T0.

(c) From the irradiation of the semiconductor film M1 with the second laser beam onward, the same processing as that of (b) is repeated until the number of times of laser beam irradiation becomes n. That is, after irradiating the semiconductor film M1 with the k-th (3≤k≤n−1) laser beam, a wait is made until the temperature of the semiconductor film M1 is lowered to near the normal temperature T0 in order to irradiate the semiconductor film M1 with the k-th+1 laser beam having the energy density I0.

The energy density I0 of the laser beam is the optimum energy density (OED) [mJ/cm2] when the temperature of the semiconductor film M1 is about the normal temperature T0 (about 30° C.). The crystalline quality of p-Si greatly depends on the energy density of the irradiated laser beam, and the energy density does not become satisfactory if it is too low or too high. When the energy density of the laser beam applied to the semiconductor film M1 is I0 which is the optimum energy density at the normal temperature T0, good crystalline quality cannot be obtained when the temperature of the semiconductor film M1 is 100° C. or higher. Here, the good crystalline quality means that the grain size is large and the growth direction is uniform in the semiconductor film M1. Thus, as described above, when the energy density in each irradiation is made equal at I0, after the semiconductor film M1 is irradiated with a laser beam once, it waited until the temperature of the semiconductor film M1 is lowered to near the normal temperature T0 to irradiate the semiconductor film M1 with the next laser beam. That is, since the energy density I0 is OED when the temperature of the semiconductor film M1 is the normal temperature, in order to make the energy density in each irradiation constant at I0, it is necessary to make the temperature of the semiconductor film M1 before the laser beam irradiation close to the normal temperature.

A pulse width Ts (oscillation time of one laser beam) of a laser beam is commonly several ns to several tens of ns, and the oscillation frequency is several hundred Hz or less. On the other hand, a waiting time Td required for the temperature raised by the irradiation to fall to the normal temperature T0 after the irradiation with a laser beam once is several ms, which is relatively long. Thus, in the laser processing method according to Comparative Example 1, the waiting time after the irradiation with a laser beam until the irradiation with the next laser beam is long. As a result, the processing time per one semiconductor film is increased, and the throughput is increased.

It is known that a semiconductor film M1 having a large particle size and a uniform growth direction can be obtained by irradiating the semiconductor film M1 with a laser beam a plurality of times (e.g., 20 times.) and repeating a phase change of melting and solidification in the semiconductor film M1. Here, a freezing point T2, which is the temperature at which the melted semiconductor film M1 is solidified, is a temperature close to the melting point T1, which is the temperature at which the semiconductor film M1 is melted (freezing point T2 is slightly lower than melting point T1 due to the supercooling phenomenon).

For example, when the temperature of the freezing point T2 of the semiconductor film M1 is about 800° C., when the semiconductor film M1 is irradiated with a laser beam, the temperature of the semiconductor film M1 rises to about 1400° C. As described above, in the laser processing method according to Comparative Example 1, a wait is made until the temperature of the semiconductor film M1 falls to about the normal temperature T0. Thus, since the solidification temperature of the semiconductor film M1 is about 800° C., the amount of energy released while the temperature of the semiconductor film M1 falls from 800° C. to 30° C. is wasted.

Laser Processing Method Performed by Laser Processing Apparatus According to First Embodiment Next, a laser processing method performed by the laser processing apparatus 1 according to the first embodiment will be described. In the laser processing method performed by the laser processing apparatus according to this embodiment, the state of the semiconductor film M1 is measured, and the timing at which the next laser beam is applied and the energy density of the laser beam to be irradiated are adjusted based on a result of the measurement. The state of the semiconductor film M1 is detected by measuring at least one of a reflectance, a transmittance, an emissivity, and a resistance value of the semiconductor film M1.

Figure 4:
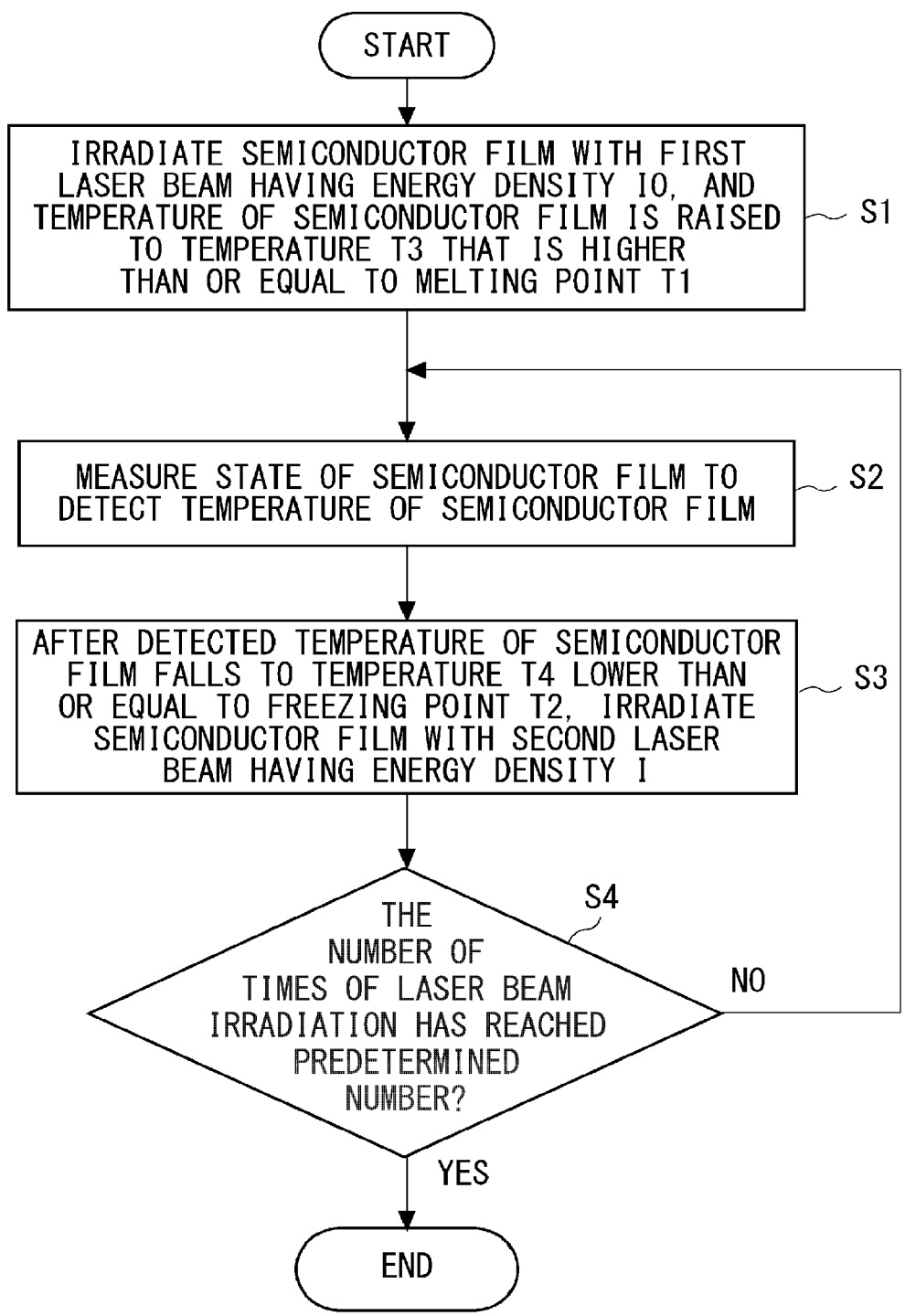
FIG. 4 is a flowchart showing a laser processing method performed by the laser processing apparatus according to the first embodiment.

FIG. 4 is a flowchart showing the laser processing method performed by the laser processing apparatus 1 according to the first embodiment. As shown in FIG. 4, first, the semiconductor film M1 is irradiated with the first laser beam having the energy density I0 (first energy intensity), and the temperature of the semiconductor film M1 is raised to the temperature T3 higher than or equal to the melting point T1 (Step S1). At this time, the semiconductor film M1 is in an amorphous state. Next, the state of the semiconductor film M1 is measured by the film state measuring instrument 5 to detect the temperature of the semiconductor film M1 (Step S2).

Following Step S2, after the detected temperature of the semiconductor film M1 falls to a temperature T4 lower than or equal to the freezing point T2, the semiconductor film M1 is irradiated with the second laser beam having the energy density I (second energy intensity) smaller than the energy density I0 (Step S3). Next, it is determined whether the number of times of laser beam irradiation has reached a predetermined number (Step S4). In Step S4, when the number of times of laser beam irradiation reaches the predetermined number (YES), the process is ended. In Step S3, when the number of times of laser beam irradiation has not reached the predetermined number (NO), the process returns to Step S2. When the number of times of laser beam irradiation has reached the predetermined number (YES), the process is ended. When the process is ended, the semiconductor film M1 becomes a polycrystalline state.

The energy density I0 in Step S1 and the energy density I in Step S2 are set in advance by a preliminary evaluation or the like. A specific method for setting the energy densities I0 and I will be described later.

Figure 5:
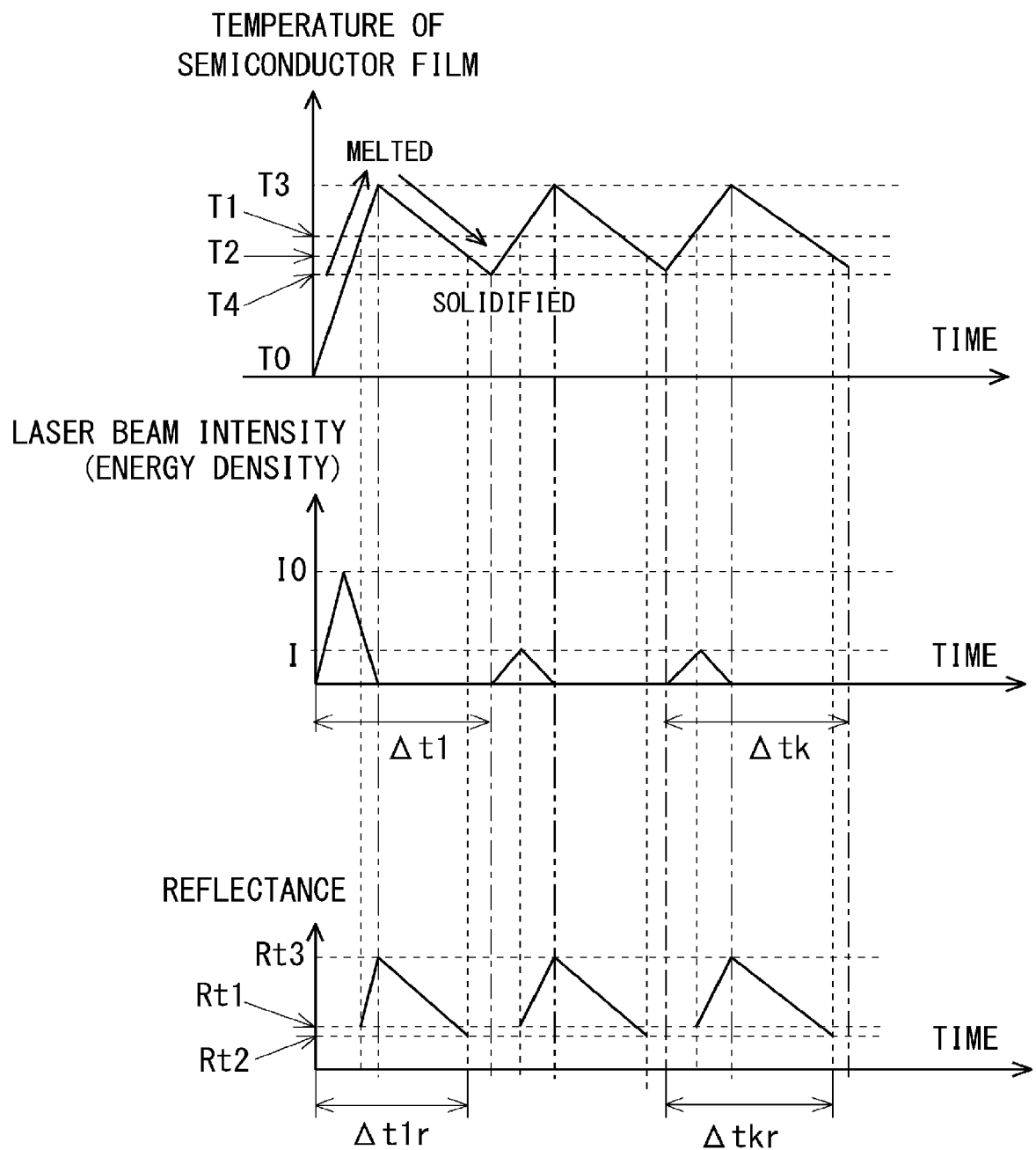
FIG. 5 is a schematic diagram for explaining a laser processing method according to the first embodiment.

FIG. 5 is a schematic diagram for explaining the laser processing method according to the first embodiment. In FIG. 5, the relationship between the temperature of the semiconductor film M1 and time is shown in the upper part, and the relationship between the laser light intensity and time is shown in the lower part.

The temperature T4 of the semiconductor film M1 is a temperature lower than or equal to the freezing point T2 and sufficiently higher than the normal temperature T0. More specifically, the temperature T4 of the semiconductor film M1 is 100° C. or higher and the freezing point T2 or lower. When the temperature of the semiconductor film M1 is the temperature T4 of 100° C. or higher, which is much higher than the normal temperature, in order to improve the crystalline quality of the semiconductor film M1 after the laser beam irradiation, it is necessary to reduce the energy density of the laser beam to be applied in such a way that it becomes smaller than I0 which is the optimum energy density at the normal temperature T0. That is, from the second laser beam irradiation onward, it is necessary to set the energy density of the laser beam to be applied to the optimum energy density I at the temperature T4.

The temperature of the semiconductor film M1 when the laser beam is applied from the second laser beam irradiation onward may not be the same every time as long as the temperature is 100° C. or higher and the freezing point T2 or lower. However, when the energy density for applying the laser beam is changed every time, the energy density of the laser beam to be applied needs to be the optimum energy density at the temperature of the semiconductor film M1 in each laser beam irradiation. Thus, it is simple to make a third laser beam applied after the second laser beam have third energy intensity, which is the same energy intensity as the second energy intensity (energy density I). After irradiation with a third laser beam having third energy intensity, the semiconductor film M1 becomes a polycrystalline state. It is preferable to set the temperature T4 as close to the freezing point T2 as possible in terms of shortening the waiting time and energy saving. For example, when the freezing point T2 of the semiconductor film M1 is about 800° C., the semiconductor film M1 is irradiated with a laser beam, and then the next laser beam is applied when the temperature of the semiconductor film M1 falls to about 790° C., which is the temperature T3 lower than or equal to the freezing point T2.

There is a correlation between the temperature and reflectance of the semiconductor film M1 in a melted state. Thus, the timing at which the semiconductor film M1 starts melting and the timing at which it is solidified can be detected by measuring the reflectance of the semiconductor film M1. That is, the reflectance when the temperature of the semiconductor film M1 is the temperature T3 is Rt3, the reflectance when the temperature of the semiconductor film M1 is the melting point T1 is Rt1, and the reflectance when the temperature of the semiconductor film M1 is the freezing point T2 is Rt2. Since the melting point T1 and the freezing point T2 are substantially equal, the reflectance Rt1 and the reflectance Rt2 are substantially equal.

Like the relationship between the temperature and the reflectance of the semiconductor film M1, there is a correlation between the temperature and the emissivity of the semiconductor film M1 in a melted state. Thus, the timing at which the semiconductor film M1 starts melting and the timing at which it is solidified may be detected by measuring the emissivity of the semiconductor film M1. Furthermore, there is a correlation between the temperature and the transmittance of the semiconductor film M1 in a melted state. Thus, the timing at which the semiconductor film M1 starts melting and the timing at which it is solidified may be detected by measuring the transmittance of the semiconductor film M1.

The timing of irradiating the semiconductor film M1 with a laser beam is when the film state measuring instrument detects that the temperature of the semiconductor film M1 has fallen to a predetermined temperature of 100° C. or higher and the melting point or lower. A difference between the irradiation timing of the first laser beam and the irradiation timing of the second laser beam is defined as $\Delta t1$. A difference between the irradiation timing of the first laser beam and the timing when the reflectance becomes R2 after the irradiation of the first laser beam is defined as $\Delta t1r$. The irradiation timing of the second laser beam is set so that $\Delta t1$ becomes longer than $\Delta t1r$ ($\Delta t1 > \Delta t1r$). For example, the difference $\Delta t1opt$ between $\Delta t1$ and $\Delta t1r$ is set to 50 ns. Similarly, the difference between the irradiation timing of the k-th ($2 \leq k \leq n-1$) laser beam and the irradiation timing of the k+1th laser beam is defined as $\Delta tk$, and the difference between the irradiation timing of the k-th laser beam and the timing at which the reflectance becomes R2 after the irradiation of the k+1th laser beam is defined as Δtkr. The irradiation timing of the k+1th laser beam is set so that Δtk becomes longer than Δtkr (Δtk>Δtkr). For example, the difference Δtkopt between Δt1 and Δt1r is set to 50 ns. Note that all values of Δtkopt, including Δt1opt, may be the same or different.

A specific method for setting the energy densities I0 and I will be described with reference to FIG. 5.

First, the semiconductor film M1 before crystallization is irradiated with a laser beam having certain energy density by the laser light source 2 a predetermined number of times, and the semiconductor film M1 after crystallization is observed by a microscope or the like to evaluate the crystalline quality.

By irradiating the semiconductor film M1 after crystallization with laser beams having different energy densities by the laser light source 2, the energy density that has achieved good crystalline quality among the different energy densities applied from the laser light source 2 is set to be the optimum energy density I0.

Next, the semiconductor film M1 before crystallization is irradiated with a laser beam having the set energy density I0 once, and then irradiated with a laser beam having certain energy density smaller than the energy density I0 a predetermined number of times, and the semiconductor film M1 after crystallization is observed by a microscope or the like to evaluate the crystalline quality. By irradiating the semiconductor film M1 after crystallization with laser beams having different energy densities by the laser light source 2, the energy density that has achieved good crystalline quality among the different energy densities applied from the laser light source 2 is set to be the optimum energy density I.

Next, the effect of the laser processing apparatus 1 according to this embodiment will be described.

In the laser processing method performed by the laser processing apparatus 1 according to the first embodiment, after a laser beam is applied once, the next laser beam is applied when the temperature increased by the irradiation becomes the freezing point T2 or lower. By doing so, in a case where a wait is made until the temperature of the semiconductor film M1, which has been raised by the irradiation after irradiation of a laser beam once, falls to about the normal temperature, the waiting time until the next laser beam is applied after a laser beam is applied can be shortened. Then, the processing time per one semiconductor film M1 is shortened and the throughput can be shortened.

Further, the energy density of the laser beam to be applied can be made smaller than the energy density of the laser beam to be applied for the first time from the second laser beam irradiation onward. This improves the energy saving performance.

Second Embodiment

Configuration of Laser Processing Apparatus According to Second Embodiment

Figure 6:
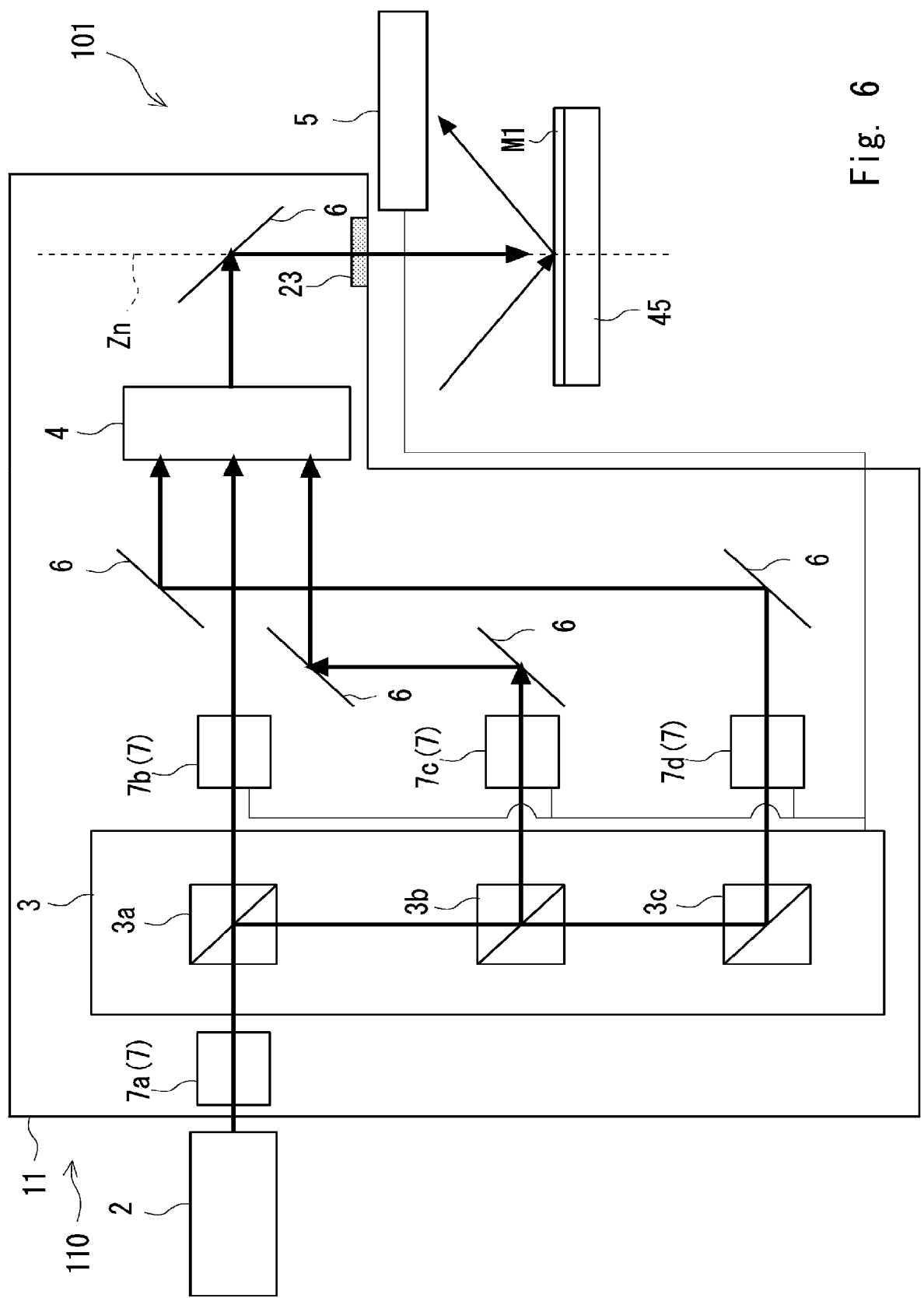
FIG. 6 is a diagram for explaining a configuration of a laser processing apparatus according to a second embodiment.

FIG. 6 is a diagram for explaining a configuration of a laser processing apparatus 101 according to this embodiment. As shown in FIG. 6, the laser processing apparatus 101 further includes an attenuator 7 for attenuating a laser beam and adjusting the energy to predetermined energy density in addition to the components of the above-described laser processing apparatus 1 according to the first embodiment shown in FIG. 1. That is, an optical system module 110 includes the attenuator 7 as an optical element in addition to the partial reflection mirror 3, the reflection mirror 6, and the homogenizer 4. The attenuator 7 is provided over the optical path between the solid-state laser 2 and the semiconductor film M1. That is, the attenuator 7 is disposed over each optical path (first optical path, second optical path, and third optical path) leading from the first partial reflection mirror 3a, the second partial reflection mirror 3b, and the third partial reflection mirror 3c to the homogenizer 4. The attenuator 7 together with the partial reflection mirror 3 perform part of a role of a laser beam adjusting mechanism. That is, the attenuator 7 and the partial reflection mirror 3 adjust the timing at which the semiconductor film M1 is irradiated with a next laser beam and adjust the intensity of this laser beam according to the state of the semiconductor film M1 measured by the film state measuring instrument 5.

Like the above-described laser processing apparatus 1 according to the first embodiment, in the laser processing apparatus 101 according to this embodiment, when a laser beam is emitted once from the laser light source 2, the semiconductor film M1 is irradiated with laser beams three times at different timings. For example, when the laser light source 2 emits a laser beam seven times, the semiconductor film M1 is irradiated with the laser beams 21 times at different timings. As described above, the semiconductor film M1 is firstly irradiated with the laser beam through the first optical path PT1 having the shortest optical path length, and then secondly irradiated with the laser beam through the second optical path PT2, and then thirdly irradiated with the laser beam through the third optical path PT3 having the longest optical path length.

Here, when a laser beam having energy density E0 is emitted once from the laser light source 2, the energy density of the laser beam that reaches the semiconductor film M1 first is defined as E1, the energy density of the laser beam that reaches the semiconductor film M1 second is defined as E2, and the energy density of the laser beam that reaches the semiconductor film M1 third is defined as E3. The reflectance of the first partial reflection mirror 3a is defined as R1, the transmittance of the first partial reflection mirror 3a is defined as T1, the reflectance of the second partial reflection mirror 3b is defined as R2, the transmittance of the second partial reflection mirror 3b is defined as T2, and the reflectance of the third partial reflection mirror 3c is defined as R3. An attenuation factor of an attenuator 7a is defined as Ta0, an attenuation factor of an attenuator 7b is defined as Ta1, an attenuation factor of an attenuator 7c is defined as Ta2, and an attenuation factor of an attenuator 7d is defined as Ta3. Then, E1, E2, and E3 are respectively expressed by the following formulas.

$$E1=(T1)\cdot Ta1\cdot(E0)\cdot Ta0$$

$$E2=(R1\cdot R2)\cdot Ta2\cdot(E0)\cdot Ta0$$

$$E3=(R1\cdot T2\cdot R3)\cdot Ta3\cdot(E0)\cdot Ta0$$

From the above formulas, a ratio r2 of the energy density E2 of the laser beam that reaches the semiconductor film M1 second to the energy density E1 of the laser beam of the laser beam that reaches the semiconductor film M1 first is $r2=E2/E1=(R1\cdot R2/T1)\cdot Ta2/Ta1$. Further, a ratio r3 of the energy density E3 of the laser beam that reaches the semiconductor film M1 third to the energy density E1 of the laser beam of the laser beam that reaches the semiconductor film M1 first is $r3=E3/E1=(R1\cdot T2\cdot R3/T1)\cdot Ta3/Ta1$. Thus, the ratios r1 and r2 can be changed by appropriately changing R1 to R3 and T1 to T3.

In the laser processing apparatus 1 according to the first embodiment, the intensity of the laser beam is adjusted only by changing the transmittance of the partial reflection mirror 3. On the other hand, in the laser processing apparatus 101 according to this embodiment, the intensity of the laser beam is finely adjusted by the attenuators 7 disposed over the first optical path, the second optical path, and the third optical path in addition to changing the transmittance of the partial reflection mirror 3. By doing so, it is possible to adjust the intensity of a laser beam more accurately.

The laser processing method performed by the laser processing apparatus 101 according to this embodiment is the same as the laser processing method performed by the laser processing apparatus 1 according to the first embodiment except that intensity of a laser beam is finely adjusted by the attenuator 7. Hence, the description of the laser processing method performed by the laser processing apparatus 101 according to this embodiment is omitted.

Third Embodiment

Configuration of Laser Processing Apparatus According to Third Embodiment

Figure 7:
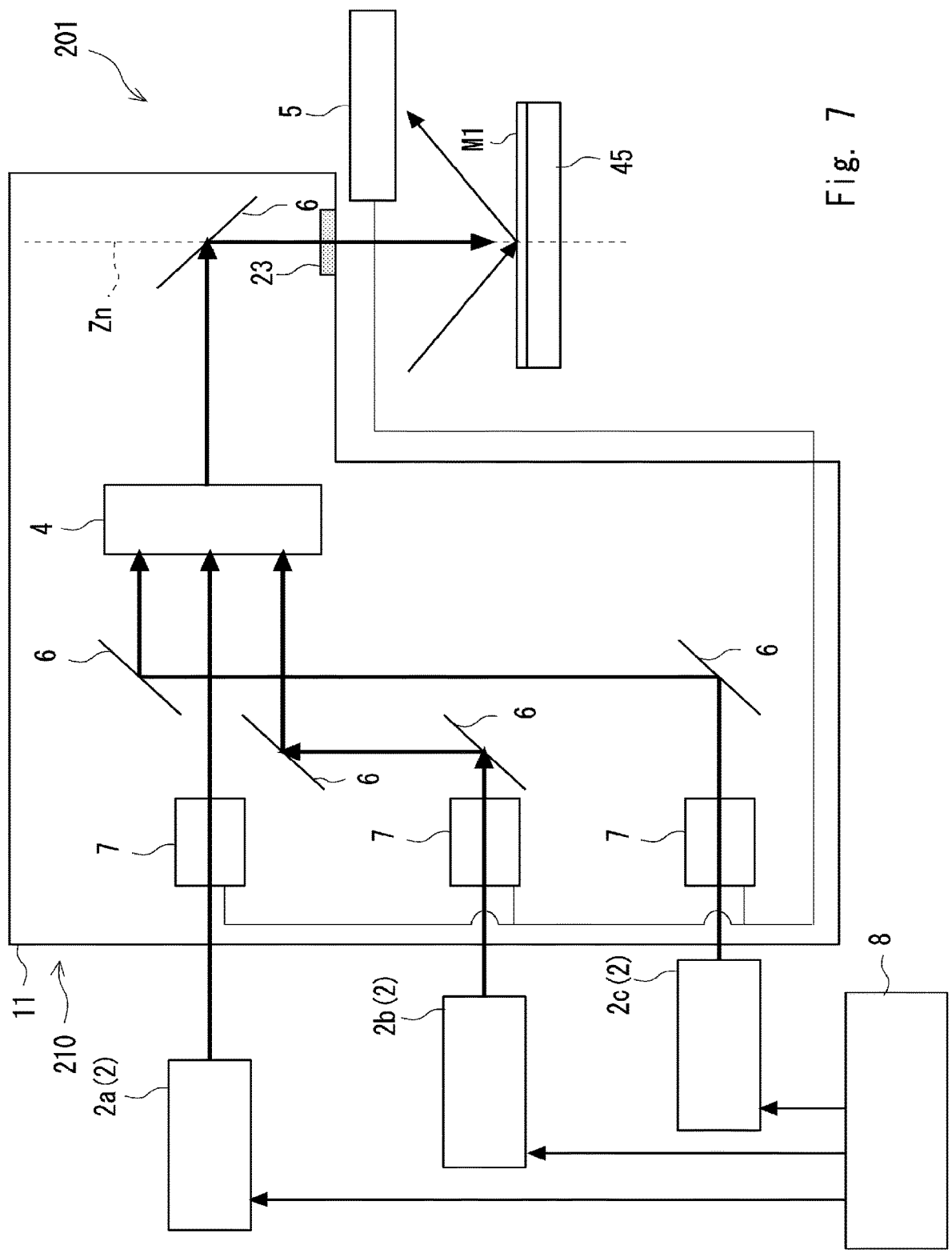
FIG. 7 is a diagram for explaining a configuration of a laser processing apparatus according to a third embodiment.

FIG. 7 shows a configuration example of the laser processing apparatus 201 according to this embodiment. In the above-described laser processing apparatus 1 according to the first embodiment shown in FIG. 1, there is a single laser light source 2, whereas as shown in FIG. 7, the laser processing apparatus 201 according to this embodiment includes a plurality of laser light sources 2 (laser light sources 2a, 2b, and 2c). Further, the laser processing apparatus 201 according to this embodiment further includes a pulse generator 8 for applying laser beams from the plurality of laser light sources 2a, 2b, and 2c with a time difference therebetween. The pulse generator 8 perform part of a role of a laser beam adjusting mechanism.

In the laser processing apparatus 201 according to this embodiment, the laser beam emission timing of each of the laser light sources 2a, 2b, and 2c is adjusted by the pulse generator 8 to thereby adjust an irradiation interval between a time when a laser beam is applied and a time when a laser beam is applied next. Further, the laser processing apparatus 201 according to this embodiment further includes, in an optical system module 210, attenuators 7 for attenuating a laser beam and adjusting the energy to predetermined energy density in addition to optical elements such as the reflection mirror 6 and the homogenizer 4. The attenuators 7 are provided in respective optical paths from the laser light sources 2a, 2b, and 2c to the semiconductor film M1. The attenuator 7 together with the pulse generator 8 has a part of the role of the laser light adjusting mechanism. That is, the attenuator 7 and the pulse generator 8 adjust the timing at which the semiconductor film M1 is irradiated with a next laser beam and adjust the intensity of this laser beam according to the state of the semiconductor film M1 measured by the film state measuring instrument 5.

When there is only one laser light source, like in the above-described laser processing apparatus 1 according to the first embodiment, a laser beam emitted from the laser light source needs to be divided by an optical system such as the partial reflection mirror 3 so that the divided laser beams pass through plurality of optical paths having different lengths to be applied to the semiconductor film M1. On the other hand, in the laser processing apparatus 201 according to this embodiment, the configuration of the optical system can be simpler, and thus the space required for disposing the optical system can be reduced, thereby reducing the apparatus size.

The laser processing method performed by the laser processing apparatus 201 according to this embodiment is the same as the laser processing method performed by the laser processing apparatus 1 according to the first embodiment except that the pulse generator 8 creates a time difference between the timing at which the plurality of laser light sources 2a, 2b, and 2c apply laser beams.

Fourth Embodiment

Configuration of Laser Annealing Apparatus According to Fourth Embodiment

A laser annealing apparatus as another laser processing apparatus according to the fourth embodiment will be described. The laser annealing apparatus according to this embodiment performs processing for irradiating a semiconductor film formed over a substrate with a laser beam to crystallize the semiconductor film. When laser annealing is performed using, for example, an excimer laser as a laser beam, the laser annealing apparatus is used as an Excimer Laser Anneal (ELA) apparatus.

Figure 8:
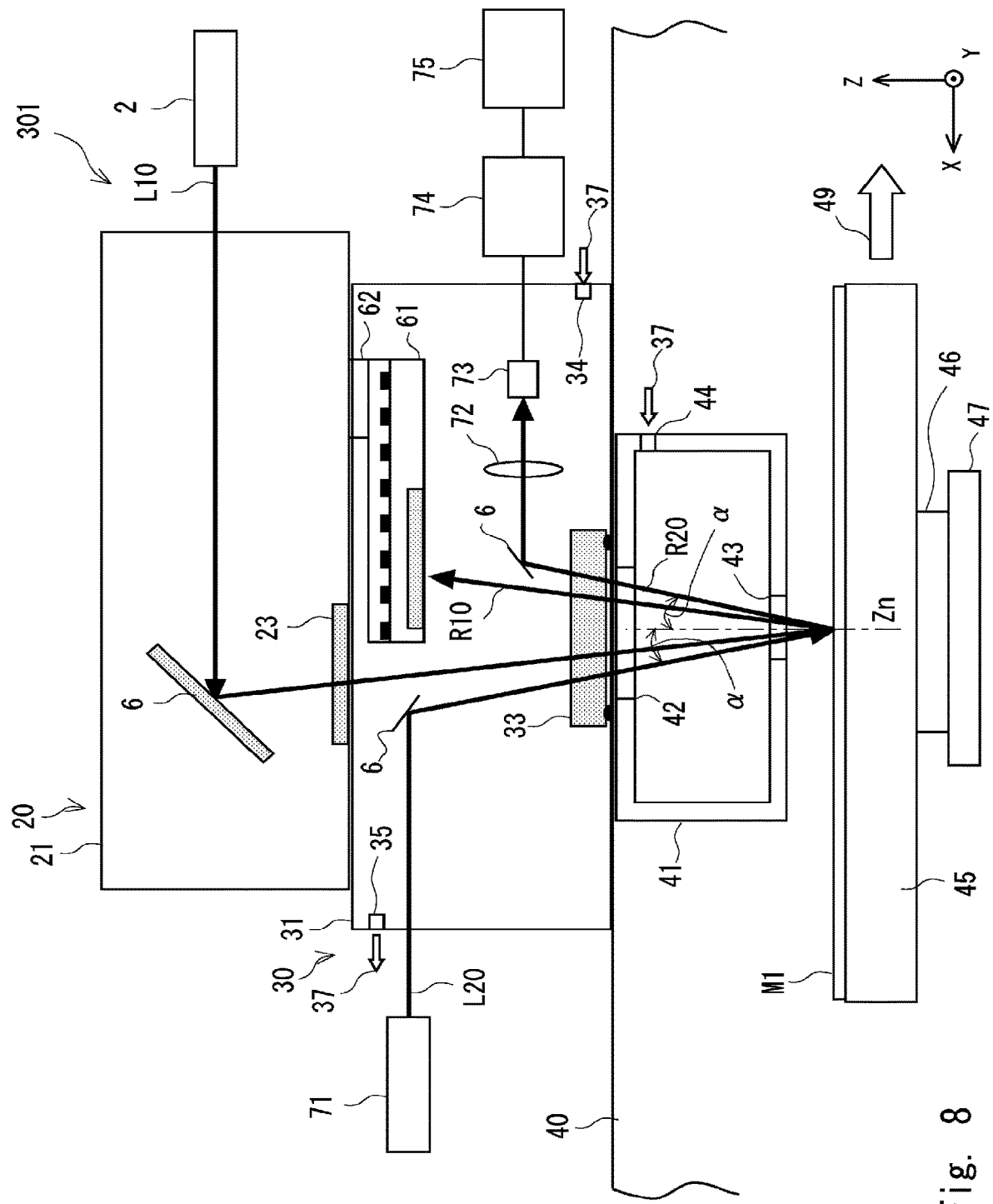
FIG. 8 is a schematic sectional view showing an example of a laser annealing apparatus according to a fourth embodiment.

FIG. 8 shows a schematic sectional view showing an example of the laser annealing apparatus according to the fourth embodiment. As shown in FIG. 8, the laser annealing apparatus 301 includes a laser light source 2, an optical system module 20, a sealing unit 30, and a processing chamber 40. The processing chamber 40 is provided, for example, over a horizontal base. The sealing unit 30 is provided above the processing chamber 40, and the optical system module 20 is provided above the sealing unit 30. The optical system module 20 is provided at a position where the optical system module 20 can receive a laser beam L emitted from the laser light source 2.

Here, XYZ orthogonal coordinate axes are introduced in order to describe the laser annealing apparatus 301. The direction orthogonal to the upper surface of the base 48 is defined as a Z-axis direction, an upper direction of the Z-axis direction is defined as a +Z-axis direction, and a lower direction of the Z-axis direction is defined as a −Z-axis direction. The direction connecting the laser light source 2 to the optical system module 20 is defined as an X-axis direction, a direction from the laser light source 2 toward the optical system module 20 is defined as a +X-axis direction, and a direction opposite to the +X-axis direction is defined as a −X-axis direction. A direction orthogonal to the X-axis direction and the Z-axis direction is defined as a Y-axis direction, one direction of the Y-axis direction is defined as a +Y-axis direction, and a direction opposite to the +Y-axis direction is defined as a −Y-axis direction.

As shown in FIG. 8, the laser light source 2 is a laser light source that emits the laser beam L10. The laser light source 2 is, for example, an excimer laser light source and emits the laser beam L10 of an excimer laser having a center wavelength of 308 nm. The laser light source 2 emits the laser beam L10 toward the optical system module 20. The laser beam L10 travels, for example, in the +X-axis direction and enters the optical system module 20.

As shown in FIG. 8, the optical system module 20 includes an optical system casing 21 that constitutes an outer shape, optical elements such as a reflection mirror 6 and a lens 72, and a sealing window 23. The optical system casing 21 is a box-shaped member made of a material such as aluminum. Each optical element of the optical system module 20 is held inside the optical system casing 21 by a holder or the like. With such optical elements, the optical system module 20 adjusts the irradiation direction, the light amount, and the like of the laser beam L10 emitted from the laser light source 2.

The configuration of the optical system module 10 of the laser processing apparatus 1 according to the first embodiment is applied as a configuration of the optical system module 20. The configuration of the above-described optical system module 110 of the laser processing apparatus 101 according to the second embodiment or the configuration of the laser processing apparatus 201 of the optical system module 210 according to the third embodiment may be applied as the configuration of the optical module 20.

The sealing window 23 is provided over a part of the optical system casing 21, for example, over a lower surface of the optical system casing 21. After the laser beam L10 is adjusted by the optical system module 20, the laser beam L10 is emitted from the sealing window 23 toward the sealing unit 30. In this way, the optical system module 20 irradiates the semiconductor film M1 with the laser beam L10.

Figure 9:
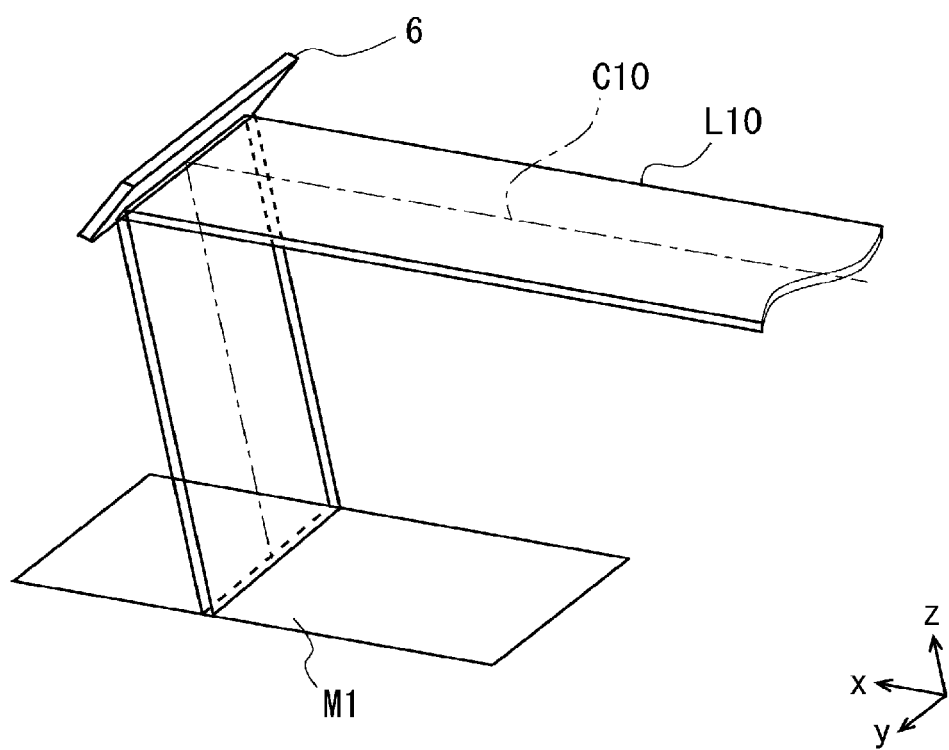
FIG. 9 is a schematic diagram showing a laser beam generated by a light source of the laser annealing apparatus according to the fourth embodiment.

As shown in FIG. 9, the laser beam L10 has a line beam shape in the optical system module 20. That is, the cross section of the laser beam L10 orthogonal to an optical axis C10 is an elongated linear shape extending in one direction. For example, a cross section of the laser beam L10 orthogonal to the optical axis of the laser beam L10 reflected by the reflection mirror 6 is a linear shape extending in the Y-axis direction.

As shown in FIG. 8, the sealing unit 30 includes a sealing casing 31, a reflected light receiving member 61, a sealing window 33, a gas inlet 34, and a gas outlet 35.

The sealing casing 31 is a box-shaped member with a hollow inside. Each of the gas inlet 34 and the gas outlet 35 is provided over a predetermined side surface of the sealing casing 31. The gas inlet 34 and the gas outlet 35 are provided, for example, over side surfaces of the sealing casing 31 opposite to each other. For example, the gas outlet 35 is provided above the gas inlet 34. A gas 37, for example, an inert gas such as nitrogen is introduced from the gas inlet 34. The gas 37 introduced inside the sealing casing 31 from the gas inlet 34 is discharged from the gas outlet 35. It is desirable that the gas 37 be continuously supplied inside the sealing casing 31. Further, it is desirable that the gas 37 be continuously discharged to the outside of the sealing casing 31. A flow rate of the gas 37 is controlled to a predetermined flow rate so that the inside of the sealing casing 31 is constantly ventilated.

The reflected light receiving member 61 is disposed inside the sealing casing 31. For example, the reflected light receiving member 61 is disposed outside the optical system module 20 in such a way that the reflected light receiving member 61 is spaced from the optical system module 20. The reflected light receiving member 61 is, for example, a plate-shaped member. The reflected light receiving member 61 is disposed with a plate surface facing the Z-axis direction. The reflected light receiving member 61 is disposed in such a way that it can receive a reflected beam R1 of the laser beam L10 reflected to the semiconductor film M1. For example, the reflected light receiving member 61 is disposed over the optical path of the reflected beam R1 in consideration of an incident angle of the laser beam L10 and a reflection angle of the reflected beam R1. Note that the reflected light receiving member 61 may be attached to the optical system module 20 with a heat insulating material 62 and a space therebetween. By doing so, heat insulation between the reflected light receiving member 61 and the optical system module 20 can be maintained.

The sealing window 33 is provided over a part of the sealing casing 31, for example, over a lower surface of the sealing casing 31. The laser beam L10 emitted from the sealing window 23 of the optical system module 20 is emitted from the sealing window 33 of the sealing unit 30 toward the processing chamber 40.

The processing chamber 40 includes a gas box 41, a substrate stage 45, a substrate base 46, and a scanning apparatus 47. For example, in the processing chamber 40, the semiconductor film M1 disposed over the substrate stage 45 is irradiated with the laser beam L10 and then subject to laser annealing processing for crystallizing the semiconductor film M1. The substrate stage 45 may be a float type stage, i.e., a stage that transports the substrate over which the semiconductor film M1 to be irradiated is floated.

The gas box 41 is a box-shaped member with a hollow inside. The gas box 41 is disposed above the substrate stage 45 and below the sealing window 33 in the sealing unit 30. An introduction window 42 is provided over an upper surface of the gas box 41. The introduction window 42 is disposed to face the sealing window 33. An irradiation window 43 is provided over a lower surface of the gas box 41. The irradiation window 43 is disposed to face the semiconductor film M1.

A gas inlet 44 is provided over a predetermined side surface of the gas box 41. A predetermined gas 37, for example, an inert gas such as nitrogen is supplied to the gas box 41 from the gas inlet 44. After the inside of the gas box 41 is filled with the gas 37 supplied to the gas box 41, the gas 37 is discharged from the irradiation window 43.

The laser beam L10 incident over the gas box 41 is emitted from the irradiation window 43 and applied to the semiconductor film M1. The reflected light receiving member 61 is disposed in such a way that it can receive the reflected beam R10 reflected by the semiconductor film M1 of the laser beam L10 applied to the semiconductor film M1.

The semiconductor film M1 is disposed over the substrate stage 45. The substrate stage 45 is disposed over the scanning apparatus 47 with, for example, a substrate base 46 interposed therebetween. The substrate stage 45 can be moved by the scanning apparatus 47 in the X-axis direction, the Y-axis direction, and the Z-axis direction. When the laser annealing processing is performed, the substrate stage 45 is transported by the scanning of the scanning apparatus 47, for example, in a transport direction 49 in the −X-axis direction.

Further, the laser annealing apparatus 301 according to this embodiment includes a reflectance measuring system as a film state measuring instrument. The reflectance measuring system includes a measuring light source 71, a lens 72, a reflected light detector 73, a digitizer 74, an information processing apparatus 75, etc.

For example, a He—Ne laser is used as the measuring light source 71. A measuring laser beam L20 having an incident angle α with a normal line Zn of a plane of the semiconductor film M1 is made incident over the surface of the semiconductor film M1 after the semiconductor film M1 is irradiated with the laser beam L10, and a reflected beam R20 from the surface of the semiconductor film M1 is detected by a reflected light detector 73. The reflected beam R20 is a reflected beam in a direction forming a reflection angle α with a normal line zn, a direction of the laser beam is changed by the reflection mirror 6, and the reflected beam R20 enters the reflected light detector 73 via the lens 72. The optical elements, such as the reflection mirror 6 and the lens 72, which guide the reflected beam R20 to the reflected light detector 73, are disposed inside the sealing unit 30. The reflected light detector 73 is also disposed inside the sealing unit 30.

The reflected beam R20 detected by the reflected light detector 73 is converted into an electric signal, and the intensity of the reflected beam is measured by the information processing apparatus 75 such as the digitizer 74 and a personal computer (PC). The information processing apparatus 75 determines the state of the semiconductor film M1 based on the intensity of the reflected beam R20. That is, the reflectance of the semiconductor film M1 in the melted state is greater than the reflectance of the semiconductor film M1 in the solid state.

In the laser annealing apparatus 301 according to this embodiment, after a laser beam is applied once, the next laser beam is applied when the temperature increased by the irradiation becomes the freezing point T2 or lower. By doing so, when a wait is made until the temperature of the semiconductor film M1, which has been raised by the irradiation after irradiation of a laser beam once, falls to about the normal temperature, the waiting time until the next laser beam is applied after a laser beam is applied can be shortened. Then, the processing time per one semiconductor film M1 is shortened and the throughput can be shortened. The flow of the laser processing method performed by the laser annealing apparatus 301 is the same as that of the laser processing method performed by the laser processing apparatus 1 according to the first embodiment (see FIG. 4), and thus description thereof is omitted.

As described above, there is a correlation between the temperature and the reflectance of the melted semiconductor film M1 in a melted state. Thus, the timing at which the semiconductor film M1 starts melting and the timing at which it is solidified can be detected by measuring the reflectance of the semiconductor film M1 by the reflectance measuring system as the film state measuring instrument.

Fifth Embodiment

Configuration of Laser Annealing Apparatus According to Fifth Embodiment

Figure 10:
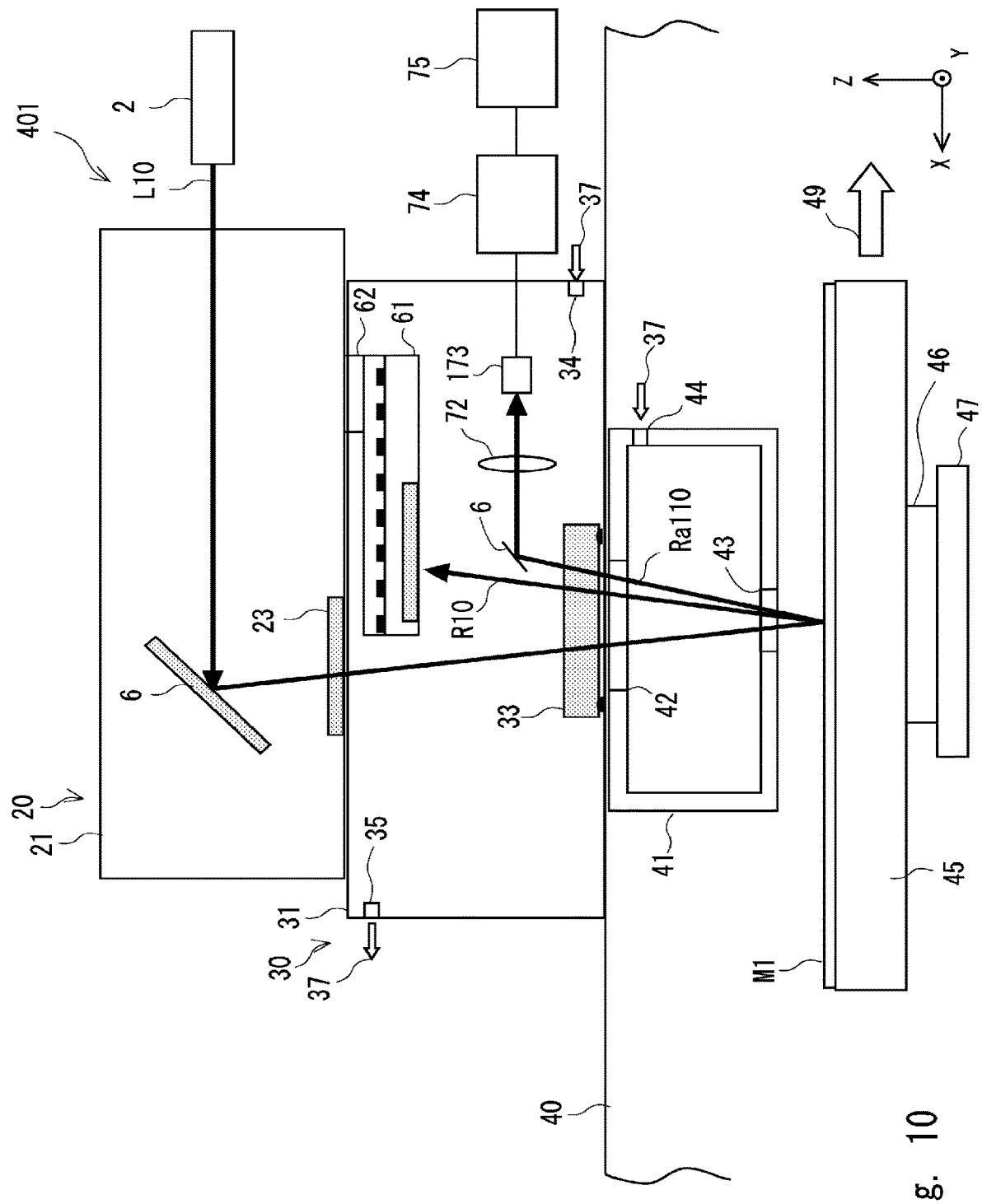
FIG. 10 is a schematic sectional view showing an example of a laser annealing apparatus according to a fifth embodiment.

A laser annealing apparatus as another laser processing apparatus according to a fifth embodiment will be described. FIG. 10 is a schematic sectional view showing an example of a laser annealing apparatus according to the fifth embodiment. A configuration of a laser annealing apparatus 401 according to this embodiment is basically the same as that of the laser annealing apparatus 301 according to the fourth embodiment. The laser annealing apparatus 301 according to the fourth embodiment includes a reflectance measuring system as a film state measuring instrument, while the laser annealing apparatus 401 according to this embodiment includes an emissivity measuring system as a film state measuring instrument.

As shown in FIG. 10, the emissivity measuring system of the laser annealing apparatus 401 includes a lens 72, an emitted light detector 173, a digitizer 74, an information processing apparatus 75, etc. An emitted beam Ra110, which is a part of the emitted beam emitted by heating an area over the surface of the semiconductor film M1 irradiated with the laser beam L10, enters the emitted light detector 173. Optical elements, such as the reflection mirror 6 and the lens 72, which guide the emitted beam Ra110 to the emitted light detector 173, are disposed inside the sealing unit 30. The emitted light detector 173 is also disposed inside the sealing unit 30. The emitted beam Ra110 detected by the emitted light detector 173 is converted into an electric signal, and the intensity of the emitted beam is measured by the digitizer 74 or the information processing apparatus 75. The information processing apparatus 75 determines the state of the semiconductor film M1 based on the intensity of the emitted beam Ra110.

In the laser annealing apparatus 401 according to this embodiment, after a laser beam is applied once, the next laser beam is applied when the temperature increased by the irradiation becomes the freezing point T2 or lower. By doing so, when a wait is made until the temperature of the semiconductor film M1, which has been raised by the irradiation after irradiation of a laser beam once, falls to about the normal temperature, the waiting time until the next laser beam is applied after a laser beam is applied can be shortened. Then, the processing time per one semiconductor film M1 is shortened and the throughput can be shortened. The flow of the laser processing method performed by the laser annealing apparatus 401 is the same as that of the laser processing method performed by the laser processing apparatus 1 according to the first embodiment (see FIG. 4), and thus description thereof is omitted.

As described above, there is a correlation between the temperature and the emissivity of the melted semiconductor film M1 in a melted state. Thus, the timing at which the semiconductor film M1 starts melting and the timing at which it is solidified can be detected by measuring the reflectance of the semiconductor film M1 by the emissivity measuring system as the film state measuring instrument.

Sixth Embodiment

Configuration of Laser Annealing Apparatus According to Sixth Embodiment

Figure 11:
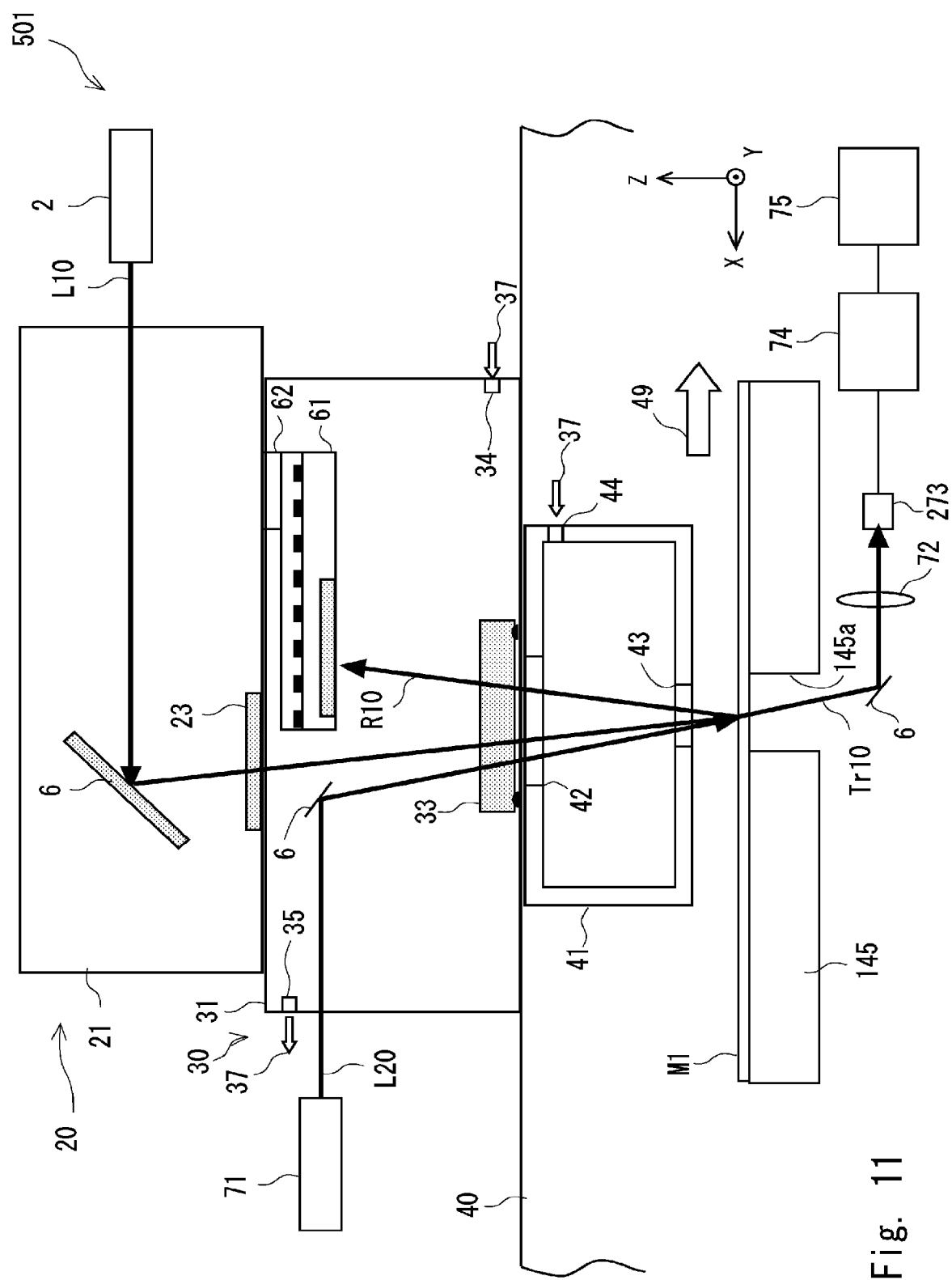
FIG. 11 is a schematic sectional view showing an example of a laser annealing apparatus according to a sixth embodiment.

A laser annealing apparatus as another laser processing apparatus according to a sixth embodiment will be described. FIG. 11 is a schematic sectional view showing an example of a laser annealing apparatus according to the sixth embodiment. A laser annealing apparatus 501 according to this embodiment includes a transmittance measuring system as the film state measuring instrument. This is a difference between the laser annealing apparatus according to the sixth embodiment and the laser annealing apparatus 301 according to the fourth embodiment including the reflectance measuring system as the film state measuring instrument.

As shown in FIG. 11, the transmittance measuring system of the laser annealing apparatus 501 includes a measuring light source 71, a lens 72, a transmitted light detector 273, a digitizer 74, an information processing apparatus 75, etc. A measuring laser beam L20 is made incident over the surface of a semiconductor film M1 after the semiconductor film M1 is irradiated with a laser beam L10, and a transmitted beam Tr10 transmitted through the semiconductor film M1 is detected by the transmitted light detector 273. A groove 145a for transmitting the transmitted beam Tr10 downward is formed in the substrate stage 145 over which the semiconductor film M1 is mounted. The substrate stage 145 may be a float type stage, i.e., a stage that transports the substrate over which the semiconductor film M1 to be irradiated is floated.

A direction of the transmitted beam Tr10 is changed by the reflection mirror 6 and enters the transmitted light detector 273 via the lens 72. Optical elements such as the reflection mirror 6 and the lens 72 for guiding the transmitted beam Tr10 to the transmitted light detector 273 are disposed below the substrate stage 145. The transmitted light detector 273 is also disposed below the substrate stage 145.

The transmitted beam Tr10 detected by the transmitted light detector 273 is converted into an electric signal, and the intensity of the emitted light is measured by the digitizer 74 or the information processing apparatus 75 such as a personal computer (PC). The information processing apparatus 75 determines the state of the semiconductor film M1 based on the intensity of the transmitted beam Tr10.

In the laser annealing apparatus 501 according to this embodiment, after a laser beam is applied once, the next laser beam is applied when the temperature increased by the irradiation becomes the freezing point T2 or lower. By doing so, when a wait is made until the temperature of the semiconductor film M1, which has been raised by the irradiation after irradiation of a laser beam once, falls to about the normal temperature, the waiting time until the next laser beam is applied after a laser beam is applied can be shortened. Then, the processing time per one semiconductor film M1 is shortened and the throughput can be shortened. The flow of the laser processing method performed by the laser annealing apparatus 501 is the same as that of the laser processing method performed by the laser processing apparatus 1 according to the first embodiment (see FIG. 4), and thus description thereof is omitted.

As described above, there is a correlation between the temperature and the transmittance of the melted semiconductor film M1 in a melted state. Thus, the timing at which the semiconductor film M1 starts melting and the timing at which it is solidified can be detected by measuring the transmittance of the semiconductor film M1 by the transmittance measuring system as the film state measuring instrument.

Seventh Embodiment

Method for Manufacturing Semiconductor Apparatus According to Seventh Embodiment Next, as a seventh embodiment, a method for manufacturing a semiconductor apparatus in the above-described laser processing apparatus will be described. In this embodiment, the laser annealing apparatus described in the fourth embodiment, fifth embodiment, or the sixth embodiment is used as the laser processing apparatus. The method for manufacturing a semiconductor apparatus according to this embodiment includes a step of preparing an object to be processed including a substrate and an amorphous semiconductor film formed over the substrate and a step of irradiating the semiconductor film with a laser beam and crystallizing the semiconductor film. As the object to be processed, a substrate over which an amorphous semiconductor film is formed, for example, a glass substrate over which amorphous silicon is formed, is used. In the step of crystallizing the amorphous semiconductor film, laser annealing processing using the above-described laser annealing apparatus described in the fourth to sixth embodiment is performed.

The semiconductor apparatus includes a TFT (Thin Film Transistor). In this case, an amorphous silicon film is irradiated with a laser beam and then crystallized, so that a polysilicon film is formed.

FIGS. 12 to 16 are cross-sectional views showing an example of the method for manufacturing a semiconductor apparatus. The above-described laser processing apparatus according to this embodiment is suitable for manufacturing a TFT array substrate. Hereinafter, a method for manufacturing a semiconductor apparatus including a TFT will be described.

Figure 12:
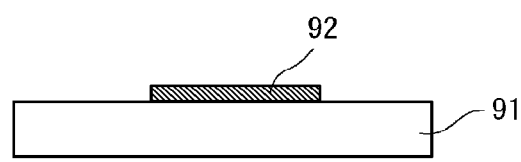
FIG. 12 is a cross-sectional view for explaining an example of a method for manufacturing a semiconductor apparatus according to a seventh embodiment.
Figure 13:
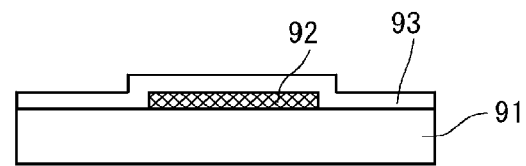
FIG. 13 is a cross-sectional view for explaining the example of the method for manufacturing a semiconductor apparatus according to the seventh embodiment.
Figure 14:
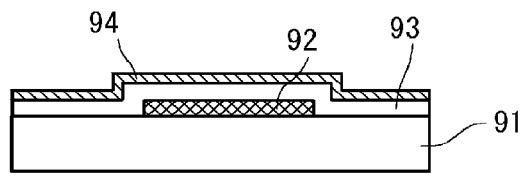
FIG. 14 is a cross-sectional view for explaining the example of the method for manufacturing a semiconductor apparatus according to the seventh embodiment.

First, as shown in FIG. 12, a gate electrode 92 is formed over a glass substrate 91. For example, a metal thin film containing aluminum or the like can be used as the gate electrode 92. Next, as shown in FIG. 13, a gate insulating film 93 is formed over the gate electrode 92. The gate insulating film 93 is formed to cover the gate electrode 92. After that, as shown in FIG. 14, an amorphous silicon film 94 is formed over the gate insulating film 93. The amorphous silicon film 94 is disposed to overlap the gate electrode 92 with the gate insulating film 93 interposed therebetween. As described above, first, a substrate over which an amorphous semiconductor film is formed is prepared (Step A).

The gate insulating film 93 is a silicon nitride film ($SiN_x$), a silicon oxide film ($SiO_2$ film), or a laminated film of these, etc. Specifically, the gate insulating film 93 and the amorphous silicon film 94 are continuously formed by a CVD (Chemical Vapor Deposition) method. The glass substrate 91 with the amorphous silicon film 94 becomes the semiconductor film M in the laser processing apparatus.

Figure 15:
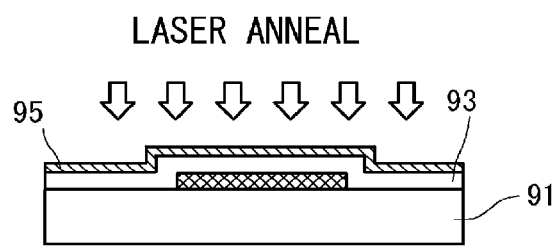
FIG. 15 is a cross-sectional view for explaining the example of the method for manufacturing a semiconductor apparatus according to the seventh embodiment.

Then, as shown in FIG. 15, the amorphous silicon film 94 is irradiated with a laser beam to crystallize the amorphous silicon film 94 using the above-described laser processing apparatus, so that a polysilicon film 95 is formed. For example, a first position control signal for controlling a disposed position of the substrate over the substrate stage 45 is transmitted to a loading/unloading apparatus (not shown) that loads and unloads the substrate (Step B). Then, the substrate is disposed by the loading/unloading apparatus at a first position over the substrate stage 45 determined by the first position control signal (Step C). After that, the substrate is transported over the substrate stage 45 (Step D), and the substrate is irradiated with a laser beam to polycrystallize an amorphous semiconductor film (Step E). After the amorphous semiconductor film is polycrystallized, the substrate is unloaded by the loading/unloading apparatus (Step F).

When all the irradiation areas are not irradiated, a second position control signal is further transmitted to the loading/unloading apparatus (Step G), and the substrate is disposed by the loading/unloading apparatus to a second position different from the first position over the substrate stage 45 determined by the second position control signal (Step H). Then, the substrate is transported to a laser beam irradiation position over the substrate stage 45 (Step I), and the substrate is irradiated with a laser beam (Step J). Then, the polysilicon film 95 in which silicon is crystallized is formed over the gate insulating film 93.

At this time, in the above-described laser processing method performed by the laser processing apparatus according to this embodiment, after a laser beam is applied once, the next laser beam is applied when the temperature increased by the irradiation becomes the freezing point or lower. Thus, the waiting time after the irradiation of the laser beam until the temperature of the semiconductor film M1, which has risen by the irradiation, drops to about the normal temperature after the irradiation of the laser beam, can be shortened. Then, the processing time per one semiconductor film M1 is shortened and the throughput can be shortened.

After all the irradiation areas are irradiated and the semiconductor film is polycrystallized, the substrate is unloaded by the loading/unloading apparatus (Step K).

Figure 16:
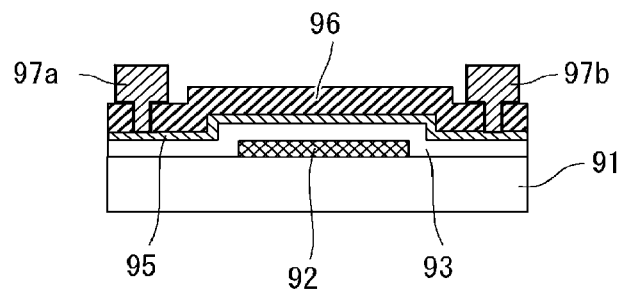
FIG. 16 is a cross-sectional view for explaining the example of the method for manufacturing a semiconductor apparatus according to the seventh embodiment.

After that, as shown in FIG. 16, an interlayer insulating film 96, a source electrode 97a, and a drain electrode 97b are formed over the polysilicon film 95. The interlayer insulating film 96, the source electrode 97a, and the drain electrode 97*b* can be formed by using a common photolithography method or film forming method.

A semiconductor apparatus provided with a TFT including a polycrystalline semiconductor film can be manufactured using the above-described method for manufacturing a semiconductor apparatus. Such a semiconductor apparatus may be used for controlling a display. Note that the subsequent manufacturing steps differ depending on the device to be eventually manufactured, and thus the description of the subsequent manufacturing steps will be omitted.

As described above, the disclosure achieved by the inventor has been specifically described based on the embodiments. However, the present disclosure is not limited to the embodiments, and various modifications can be made without departing from the scope of the disclosure, as a matter of course. Further, the configuration in each embodiment may be appropriately exchanged between the embodiments.

REFERENCE SIGNS LIST 1, 101, 201 LASER PROCESSING APPARATUS
2 LASER LIGHT SOURCE
3 PARTIAL REFLECTION MIRROR
3*a* FIRST PARTIAL REFLECTION MIRROR
3*b* SECOND PARTIAL REFLECTION MIRROR
3*c* THIRD PARTIAL REFLECTION MIRROR
4 HOMOGENIZER
5 FILM STATE MEASURING INSTRUMENT
6 REFLECTION MIRROR
7 (7*a*, 7*b*, 7*c*, 7*d*) ATTENUATOR
8 PULSE GENERATOR
20, 110, 210 OPTICAL SYSTEM MODULE
11, 21 OPTICAL SYSTEM CASING
23 SEALING WINDOW
30 SEALING UNIT
31 SEALING CASING
33 SEALING WINDOW
34 GAS INLET
35 GAS OUTLET
37 GAS
40 PROCESSING CHAMBER
41 GAS BOX
42 INTRODUCTION WINDOW
43 IRRADIATION WINDOW
44 GAS INLET
45 SUBSTRATE STAGE
46 SUBSTRATE BASE
47 SCANNING APPARATUS
48 BASE
49 TRANSPORT DIRECTION
61 REFLECTED BEAM RECEIVING MEMBER
62 HEAT INSULATING MATERIAL
71 MEASURING LIGHT SOURCE
72 LENS
73 REFLECTED LIGHT DETECTOR
74 DIGITIZER
75 INFORMATION PROCESSING APPARATUS
145 SUBSTRATE STAGE
145*a* GROOVE
173 EMITTED LIGHT DETECTOR
273 TRANSMITTED LIGHT DETECTOR
301, 401, 501 LASER ANNEALING APPARATUS
M1 SEMICONDUCTOR FILM

The invention claimed is:

1. A method for manufacturing a semiconductor apparatus comprising the steps of:
   (a) irradiating a semiconductor film with a first laser beam having first energy intensity; and
   (b) after the step (a), irradiating the semiconductor film with a second laser beam having second energy intensity when a temperature of the semiconductor film falls within a range between 100° C. or higher and a freezing point or lower, the second energy intensity being smaller than the first energy intensity.

2. The method according to claim 1, further comprising a step of:
   (c) after the step (b), irradiating the semiconductor film with a third laser beam having third energy intensity, the third energy intensity being the same as the second energy intensity.

3. The method according to claim 1, further comprising a step of:
   measuring a temperature of the semiconductor film between the step (a) and the step (b).

4. The method according to claim 1, wherein
   in the step (a), the semiconductor film becomes an amorphous state, and
   after the step (b), the semiconductor film becomes a polysilicon state.

5. The method according to claim 1, wherein the semiconductor film constitutes a thin film transistor.

6. The method according to claim 5, wherein the thin film transistor is used to control a display.

7. The method according to claim 1, wherein the semiconductor film is mainly composed of a silicon.

* * * * *